(12) United States Patent
Garg et al.

(10) Patent No.: US 6,238,450 B1
(45) Date of Patent: May 29, 2001

(54) CERIA POWDER (75) Inventors: Ajay K. Garg, Northborough; Brahmanandam V. Tanikella, Natick; Arup Khaund, Northborough, all of MA (US)

(73) Assignee: Saint-Gobain Industrial Ceramics, Inc., Worchester, MA (US)

( * ) Notice: Subject to any disclaimer, the term of this patent is extended or adjusted under 35 U.S.C. 154(b) by 0 days.

(21) Appl. No.: 09/553,968

(22) Filed: Apr. 21, 2000

Related U.S. Application Data

(63) Continuation-in-part of application No. 09/334,222, filed on Jun. 16, 1999, now abandoned.

(51) Int. Cl.[7] .................................................. C04B 35/50
(52) U.S. Cl. .............................................. 51/309; 501/152
(58) Field of Search .................................. 501/126, 152, 501/309

(56) References Cited

U.S. PATENT DOCUMENTS

| | | |
|---|---|---|
| 4,106,915 | 8/1978 | Kagawa et al. . |
| 4,601,755 | 7/1986 | Melard et al. . |
| 5,527,423 | 6/1996 | Neville et al. . |
| 5,693,239 | 12/1997 | Wang et al. . |
| 5,759,917 | 6/1998 | Grover et al. . |
| 5,804,513 | 9/1998 | Sakatani et al. . |
| 5,858,813 | 1/1999 | Scherber et al. . |

FOREIGN PATENT DOCUMENTS

607703   8/1994   (EP) .

*Primary Examiner*—Paul Marcantoni
(74) *Attorney, Agent, or Firm*—David Bennett (57) ABSTRACT

A polishing slurry, useful in optical or CMP applications, comprises a ceria with a BET surface area of at least 10 $m^2/gm$. The slurry may be made by subjecting a commercial ceria slurry comprising agglomerates to a mechano-chemical treatment at a pH of from 9 to 11 using media that are low purity alpha alumina or zirconia. Preferred slurries maintain a positive surface charge at all pH values. CMP slurries preferably comprise in addition an anionic surfactant to aid in removal of surface residues.

7 Claims, 7 Drawing Sheets

CERIA POWDER

This Application is a Continuation-in-Part Ser. No. 09/334,222 filed Jun. 16, 1999 now ABN.

BACKGROUND OF THE INVENTION

The present invention relates to ceria powders and particularly to ceria powders of the type used to fine and polish optical and semiconductor surfaces.

It is well known that in order to produce a satisfactory optical surface, it is necessary that the surface be free of scratches and have as low an $R_a$ as possible. This $R_a$ measurement is the average distance between the highest and lowest points on the surface perpendicular to the plane of the glass sheet being polished. Thus, accepting that the surface will not be totally flat at the submicron scale, it is a measure of the variation between highest and lowest points. Clearly the lower the figure the better for optical clarity and freedom from distortion.

In polishing processes a slurry of abrasive particles in a liquid medium, (usually water-based), is placed in contact with the surface to be polished and a pad is caused to move across the surface in predetermined patterns so as to cause the abrasive in the slurry to polish the surface. The present invention relates to ceria particles useful in such processes.

Various slurry formulations have been proposed in the art. U.S. Pat. No. 4,576,612 produces its slurry in situ in controlled amounts by providing a pad with a surface layer comprising the abrasive particles in a resin which gradually dissolves during use to liberate the polishing particles. The particles declared to be useful include cerium oxide ("ceria"), zirconium oxide ("zirconia") and iron oxide.

EP 608 730-A1 describes an abrasive slurry for polishing a surface in an optical element which comprises an abrasive selected from alumina, glass, diamond dust, carborundum, tungsten carbide, silicon carbide or boron nitride with particle sizes up to one micron.

U.S. Pat. No. 5,693,239 describes an aqueous slurry for polishing and planarizing a metallic workpiece which comprises submicron particles of alpha alumina together with other softer form of alumina or amorphous silica.

U.S. Pat. No. 5,804,513 teaches a planarization slurry comprising ceria and alumina or silica, where the particle sizes are 2 microns or less and the ceria component is from 5 to 40% of the total weight.

U.S. Pat. No. 4,106,915 teaches a method of polishing glass using abrasive particles dispersed in a cured, unsaturated polyester resin wherein the abrasive can be ceria.

U.S. Pat. No. 4,601,755 teaches ceria-based glass polishing compositions incorporating a rare earth pyrosilicate.

A considerable amount of art also exists in the related field of slurry formulations for chemical mechanical planarization, ("CMP"), or polishing of semiconductor substrates and again, these commonly employ the same abrasives with variations in components of the dispersion medium.

The use of ceria in such applications is therefore well known and widely practiced. The ceria is commercially obtainable in reasonably small particle sizes of a little over a micron but there is always a drive to ever more perfect surfaces and this propels a move to finer ceria particle sizes still. There is however an associated problem with this move in that the ceria tends to be sensitive to agglomeration and such agglomerates can cause scratching of the surface being polished. Thus commercially available ceria tends to a reach a limiting value of around 10 A for surface roughness, $(R_a)$, when used in a slurry form to polish glass surfaces.

The present invention is based on the discovery of a form of ceria with unique characteristics that leads it to be highly successful in resisting agglomeration and polishing to $R_a$ levels of 5 Å or even lower and a method by which such ceria can be obtained.

DESCRIPTION OF THE INVENTION

The present invention provides a ceria powder that has been milled at a pH of from 9 to 12.5 to comminute a powder with a BET surface area below 10 m2/gm until the BET surface area is increased by at least 5 $m^2/gm$.

The present invention also provides a polishing slurry comprising ceria particles with a BET specific surface area of at least 10 $m^2/gm$ and a positive ionic surface charge at pH levels of 4 or lower when the pH is adjusted from such levels to basic values of 9 or higher. The ceria particles comprising such powders are essentially agglomerate-free by which is meant that the ceria is free of agglomerate particles that will not re-disperse upon stirring and that are larger than 5 microns in size.

The BET specific surface area is determined by the Brunauer/Emmett/Teller method described in *The Journal of the American Chemical Society*, 60, page 309 (February 1938). The ionic surface charge is measured in terms of the random accoustophoretic mobility by the technique described in *Langmuir*, 1988, 4, pp 611–626.

Ceria as commercially available is often present in amounts that are only 50% or more of cerium oxide, with the balance being made up primarily of rare earth metal oxides such as lanthana, neodymia and praseodymia. The preferred ceria used in the present invention comprises 70% ceria with about 30% of lanthana and is commercially available under the trade name CEROX® 1650. This product is available from Optical Manufacturers, Limited. This product has a nominal average particle size of 1.3 micrometers though in fact there were significant numbers of aggregates and a wide variation in particle size before comminution. A form of ceria with a higher actual ceria content is available from the same supplier under the trade mark Opaline®.

The ceria abrasive particles may be present along with other abrasive particles such as alpha alumina, gamma alumina, silica, zirconia and the like. Such particles however would need to be of the same order of particle size as the ceria to avoid scratching. Preferably the ceria according to the invention should represent at least 5% such as at least 10 or 20% and more preferably at least 50% of the abrasive particle weight in any such mixture.

When a slurry of the novel ceria powder of the invention is used to polish glass, after an induction period in which very little material is removed, a consistent and effective rate of material removal is achieved along with a final surface having a roughness of less than 10 Å and preferably from 3 to 7 Å. The reason for this unusual behavior is not fully understood.

The invention further comprises a process for producing ceria which maintains a positive ionic surface charge at pH values when titrated from acid values of about 4 or lower to a pH of at least 10 which comprises subjecting ceria comprising agglomerated ultimate particles and an average particle size of greater than one micron to a mechano-chemical treatment, which comprises milling a slurry of the particles using low-purity alumina or zirconia milling media and a pH of from 9 to 12.5, until an essentially de-agglomerated product with a BET surface area of at least 10 $m^2/gm$ is obtained. The pH at which the de-agglomeration occurs is preferably from 10 to 12.5 and the time required may be from seconds up to 15 days depending on the equipment used and the degree of de-agglomeration required. Conventional vibratory mills such as a Sweco mill may require seven days or more but an attrition mill can accomplish the same degree of comminution in a matter of seconds.

Usually very satisfactory results can be obtained, starting from commercially available ceria such as "CEROX" 160. This product typically has an average particle size of about 1.3 micrometers and comprises many agglomerates that are substantially larger than that. The higher quality ceria sold under the trade name "OPALINE" can also be used in the formulations of the invention after receiving the mechano-chemical milling treatment disclosed herein. It does not however appear to retain the positive surface charge during titration from acid to basic values referred to above for reasons that are not entirely clear.

The de-agglomeration is carried out using milling media selected from low purity alumina and zirconia. By "low-purity alumina" it is intended that the alpha alumina content is from about 85–90% by weight, and usually about 88% alpha alumina, the remainder being various impurities including glassy components derived from the bauxite raw material from which the media were made. Curiously enough alumina media with higher purity, such as 95%, are not so effective at generating a ceria product capable of polishing to a low surface roughness. The reason for this is not fully understood but it may be related to the tendency of such media over a protracted milling time, to break off relatively large fragments which would become mixed with the much smaller ceria particles and would lead to scratches during use.

The above slurries are well adapted to optical polishing but if the slurries are to be used for CMP applications it is not sufficient to remove material: the removed material must also be removed cleanly from the surface. To accomplish this end it is preferred that the slurry also comprise a surfactant. Of the many surfactants available, it has been found that anionic surfactants produce the most consistently effective results with the ceria slurries of the invention. Among anionic surfactants the most effective have been anionic organo-phosphates, ("APE"), such as that available from Rhodia Corp. under the trade name "Rhodafac BP769" with the pH adjusted to above 6 using a base such as ammonia, and the use of such surfactants is a preferred feature of the invention.

DESCRIPTION OF PREFERRED EMBODIMENTS

The invention is now further described with particular reference to the following Examples which are included as illustrations and are not intended to imply any essential limitations on the true scope of the invention.

Figure 5A:
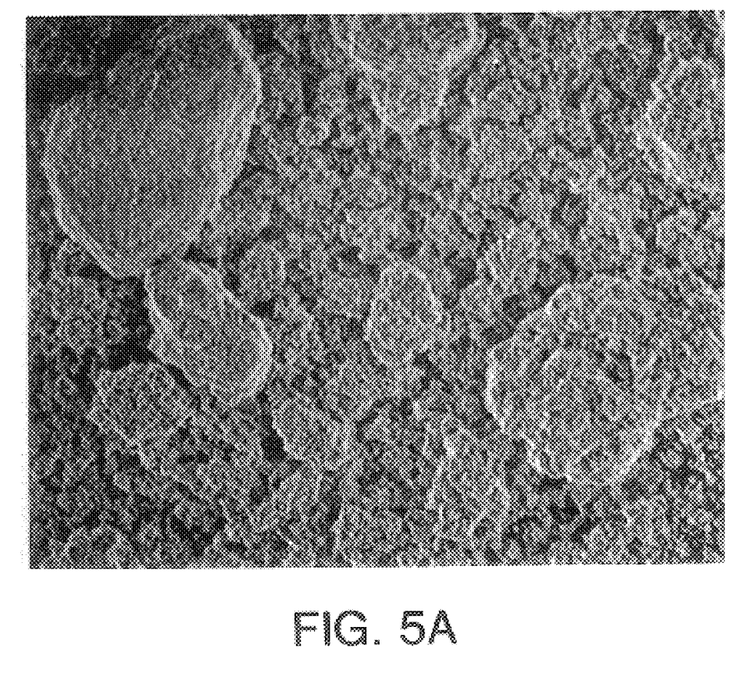
FIG. 5 is a pair of photomicrographs showing the ceria powder used in Example 2 before and after, (5a and 5b respectively), the de-agglomeration operation.

To ensure truly comparable results, the same starting ceria was used in all of Examples 1 and 2 according to the invention and Comparative Examples 1 and 2. The ceria powder was CEROX® 1650 available under that trade name from Optical Manufacturers, Limited. This product has a nominal average particle size of 1.3 micrometers though in fact, as FIG. 5a shows, there were significant numbers of aggregates and a wide variation in particle size. The product had a BET specific surface area of 4 $m^2/gm$.

Comparative Example 3 used a commercially available slurry polishing material available from Saint-Gobain Industrial Ceramics, Inc. under the trade name NORPOL™, which comprises ceria that had not been given the mechano-chemical treatment and alpha alumina. The slurry has 20% solids and a nominal particle size of 0.25 micrometer and the dispersed particles had a BET surface area of 45 $m^2/gm$.

Roughness measurements were made using a "New View" machine available from Zygo Co.

EXAMPLE 1

A ceria slurry was made by de-agglomerating 500 gm of CEROX 1650 in 4500 gm of de-ionized water in a Sweco M-18-5 mill, (using five jars), using half inch cylindrical Diamonite® low purity (88%) alumina media for seven days.

The mechano-chemically treated ceria was very uniform in particle size and free of large agglomerations. The before and after products are shown in the phtomicrographs presented as FIGS. 5a and 5b respectively. The BET specific surface area of the mechano-chemically treated powder was 18.5 $m^2/gm$. A polishing slurry was made by placing 1000 gm of the above slurry into 500 gm of de-ionized water and the pH was adjusted to 9.5–10. The polishing slurry was used to polish a glass substrate comprised of 96% silica and having an initial $R_a$ of 6000 Å using a single sided polishing machine purchased from Buehler and a SUBA-500 polishing pad from Rodel, Inc. The pad pressure was 1.5 p.s.a. and the surface speed of the pad relative to the workpiece was 1.5 m/sec. The slurry was caused to flow at a rate of about 20 cc/min.

Figure 3:
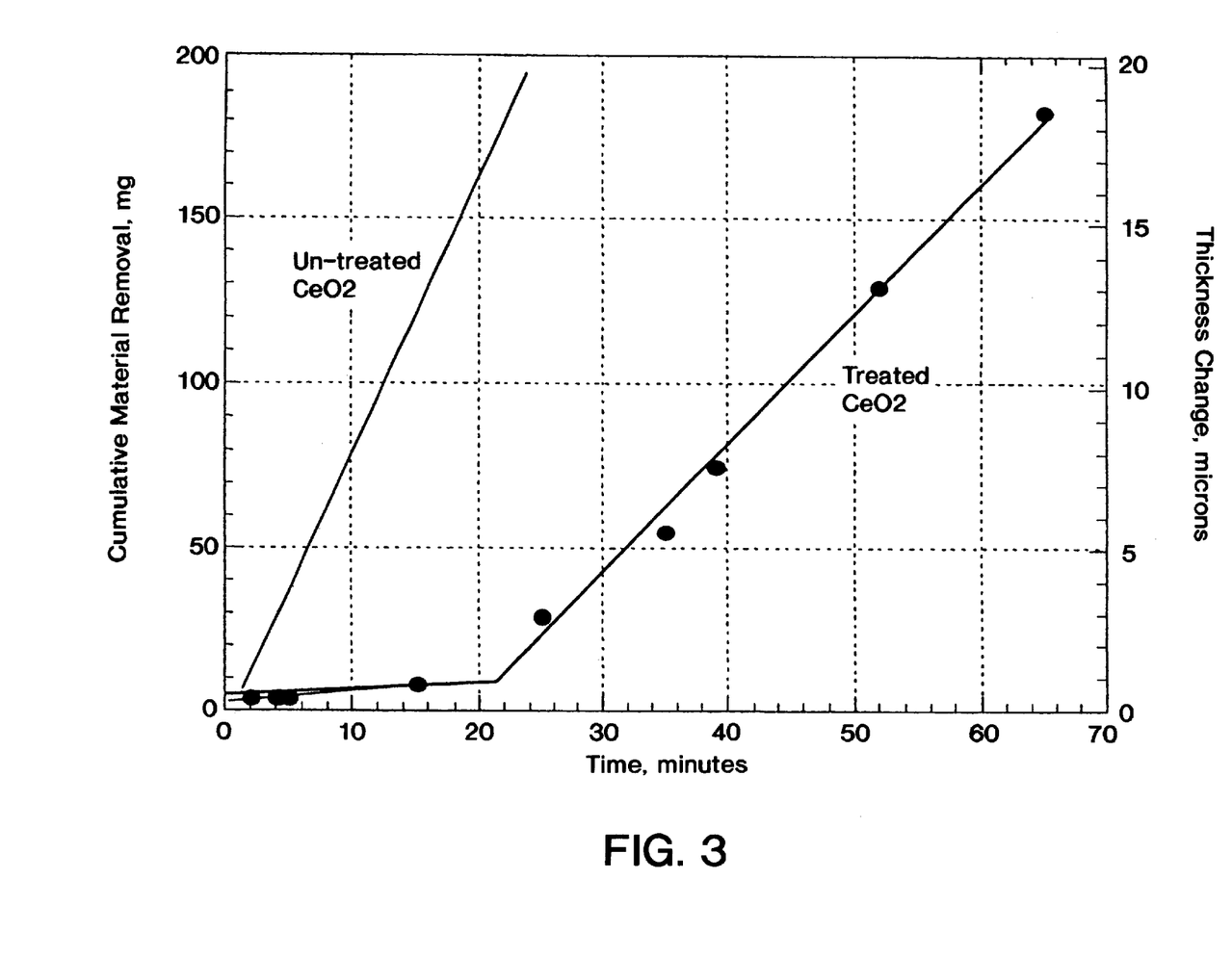
FIG. 3 is a graphical representation of the results obtained in Comparative Example 1 and Example 1 according to the invention.
Figure 4:
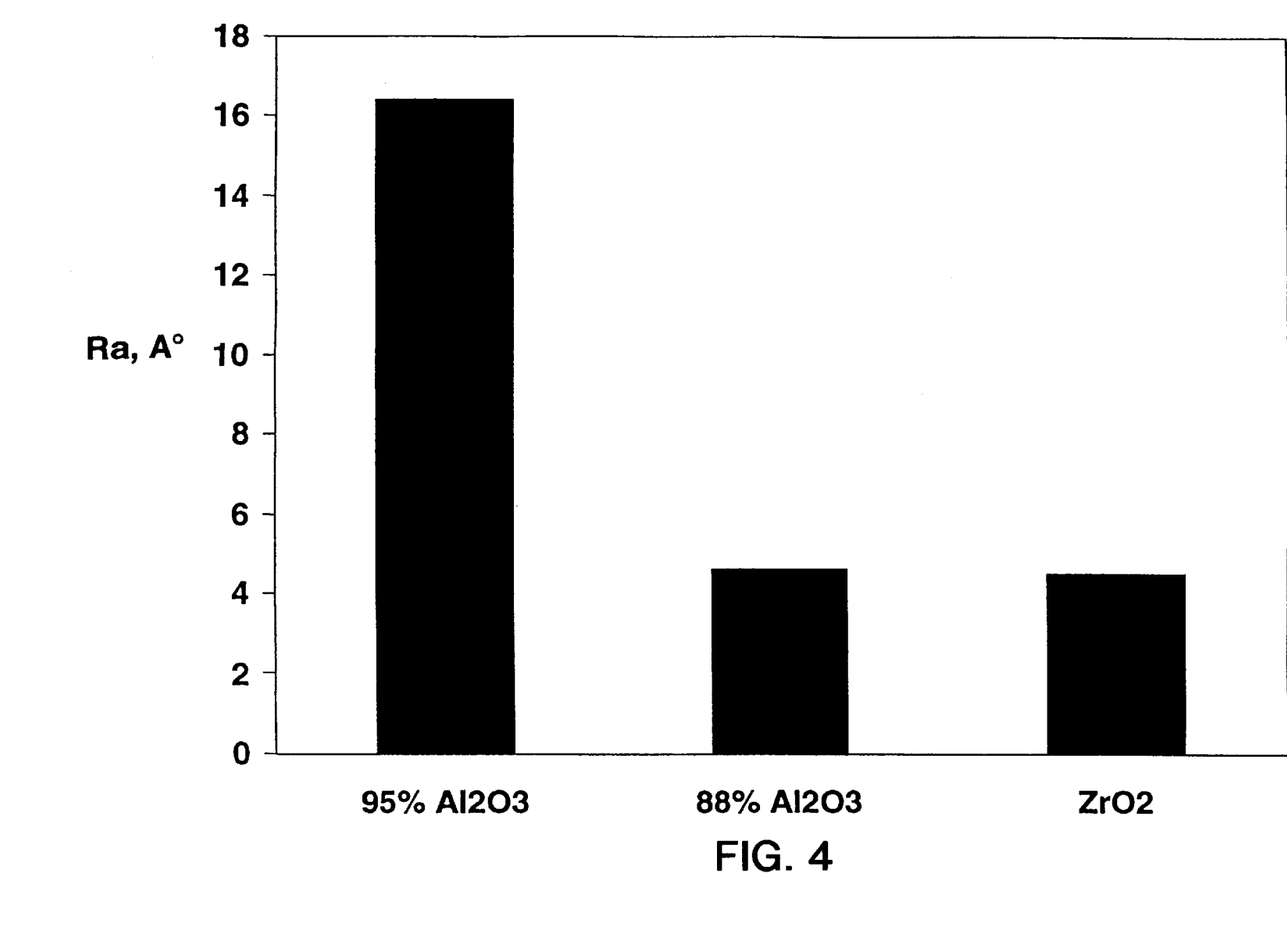
FIG. 4 is a bar chart showing the effect of variation of the milling media used to de-agglomerate the ceria powder starting material. (See Example 3).

The polishing yielded a surface with a final roughness, $R_a$, was 4 to 5 Å. The graph appearing as FIG. 3 shows two lines: the on the left being the removal rate for the ceria when used "as received", (reported in Example 1 (Comparative) below) and the one on the right the mechano-chemically treated grain prepared as described in the present Example. It will be noted that, in the first 20 minutes or so of polishing, only about 1 micrometer of thickness was removed but thereafter the amount removed increased significantly but the finish remained very good.

EXAMPLE 1 (COMPARATIVE)

In this Example 200 gm of the as-received ceria used in Example 1 was mixed with 800 gm of water and 500 gm of this slurry were further diluted by addition of 1000 gm of de-ionized water and the pH was adjusted to 10. This slurry was then used to polish a glass, (96% silica), having a roughness, $R_a$, of 6000 Å.

The polishing was performed using the same equipment and conditions as are set forth in Example 1. The polishing process removed a thickness of 40 microns and left a final surface roughness of 10.5 Å. The rate of removal is charted in Table 3.

As will be appreciated the use of ceria as received gives a much more rapid removal of material but this comes at the expense of a significantly inferior surface finish.

Figure 1:
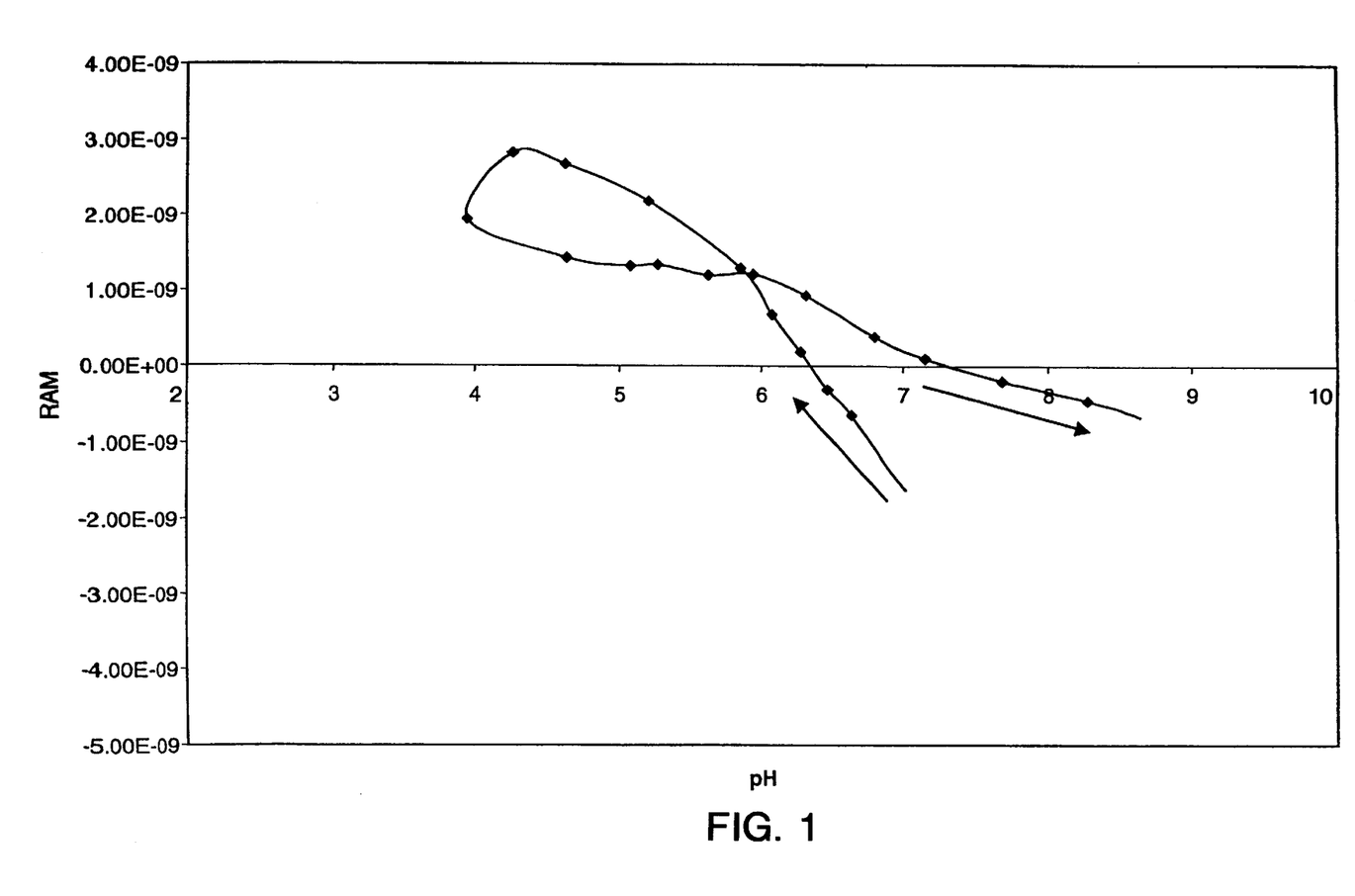
FIG. 1 is a graph illustrating the variation of surface charge with pH of a commercial ceria powder.
Figure 2:
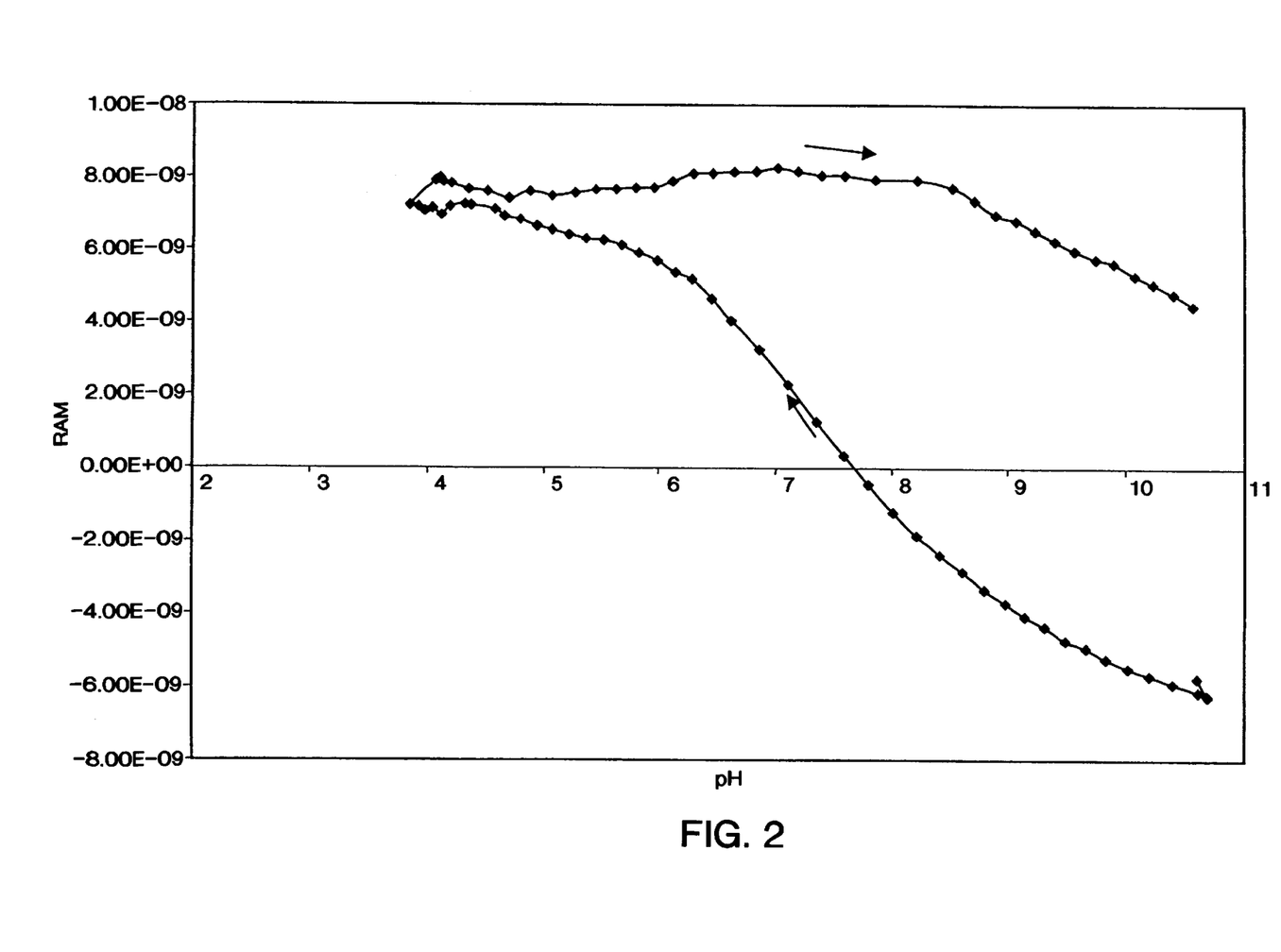
FIG. 2 is a graph illustrating the variation of surface charge with pH of a ceria powder according to the invention.

The slurry products of Example 1 and Example 1 (Comparative) as used for polishing were then examined to trace their surface charge as the pH was varied. In FIG. 1 the slurry made with the "as-received" ceria was titrated from the neutral to the acid side to a pH of about 4 and it was noted that the surface charge as reflected by the random accoustophoretic mobility, (or RAM), became strongly positive but when the slurry was titrated back to the basic side, the surface charge moved to the negative side, with a small hysteresis loss. In FIG. 2, the behavior of the slurry according to the invention is charted. Here it will be noted that, having started from a strongly negative surface charge, the addition of acid resulted in a strong movement to a positively charged surface that persisted even when the slurry was titrated back to the basic side. This behavior is quite unexpected and is not known to be displayed by other ceramic oxides.

This retention of positive surface charge appears to be very helpful both in resisting agglomeration and also in solvating silicate ions on the glass surface making their removal easier. It is also quite anomalous and indicates that comminution of this specific ceria at high pH levels brings about a mechano-chemical effect and not merely a physical size change.

EXAMPLE 2

Figure 5B:
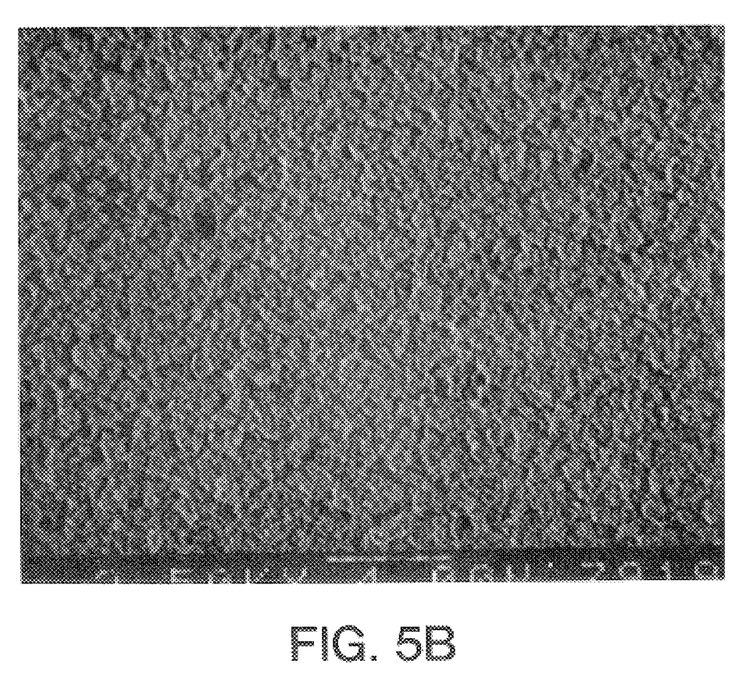
Figure 6:
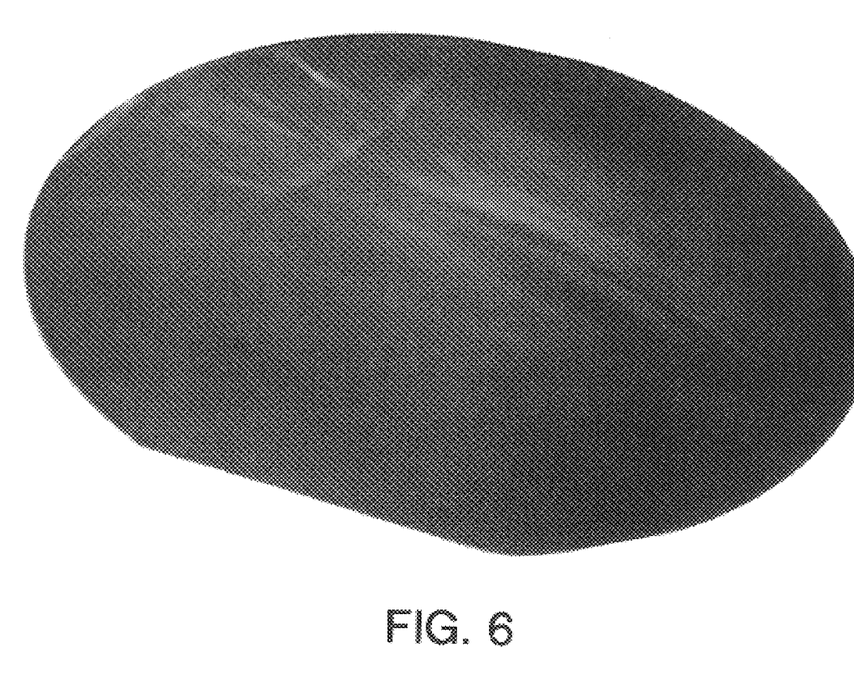
FIG. 6 is a photograph of a silicon wafer polished using a slurry according to Example 5 (Comp).
Figure 7:
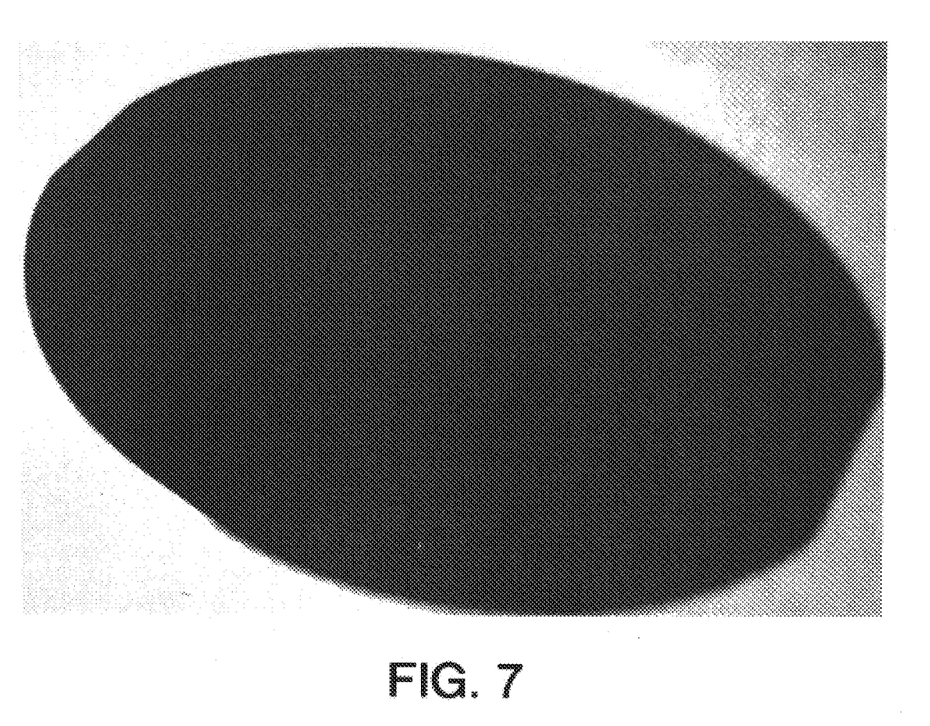
FIG. 7 is a photograph of a silicon wafer polished using a slurry according to the invention as described in Example 5.

This Example employs the same ceria starting material as was used in Example 1 and a slurry identical to that made in Example 1 was prepared and mechano-chemically treated in the same way. FIGS. 5a and 5b are photomicrographs of the powder before and after the de-agglomeration operation. The mechano-chemically treated powder had a BET surface area of 18.5 $m^2$/gm and was essentially free of agglomerates and very uniform in particle size.

A polishing slurry was made by diluting 5000 gm of the above slurry with 2500 gm of de-ionized water and this was used to polish five samples of a pure (99.99%) silica using a double-sided polishing machine made by SOMOS and a SUBA-550, ("Hard Pad"), polishing pad from Rodel, Inc. The pad pressure was 1 p.s.a. and the relative surface speed, (of the pad relative to the surface), was 2.8 m/sec. The slurry flow rate was 100 cc/min. This yielded a final surface roughness of 7–8 Å.

Polishing was then continued using a Rodel Inc. POLY-TEX pad, ("Soft Pad"), under a pressure of 0.5 p.s.a., a slurry flow rate of about 75 cc/min but using the same relative surface speed. This yielded a surface roughness of 4 Å which, when measured by the more precise atomic force microscope was reduced to 2–3 Å.

EXAMPLE 2 (COMPARATIVE)

In this Example the polishing procedures and substrates of Example 2 were duplicated using a slurry made from 500 gm of the as-received ceria powder and 4500 gm of de-ionized water. This slurry was further diluted with 10000 gm of de-ionized water and the pH measured at 5.5–6.

After the "Hard Pad" polishing the surface roughness was 9–10 Å and after continuing with the "Soft Pad" this was reduced only to 8–9 Å on the Zygo machine. These data clearly indicate the better performance obtained by the use of the mechano-chemically treated ceria made according to the process of the present invention.

EXAMPLE 3

In this Example the impact of the media used in the mechano-chemical treatment is assessed. Three evaluations were performed in identical fashion to that described in Example I with the difference only of the media used in the mechano-chemical treatment. The other media used were zirconia and 95% pure alpha alumina.

Zirconia media gave a product with a polished surface with a final surface roughness of about the same as was obtained using 88% pure alpha alumina. However when 95% pure alpha alumina was used the surface roughness was about four times higher.

EXAMPLE 3 (COMPARATIVE)

This Example follows the testing procedure of Examples 1 and 1 (Comparative) but using a commercially available glass polishing formulation comprising ceria and alpha alumina powders with a 0.25 micrometer nominal average particle size and a BET surface area of 45 $m^2$/gm. The formulation is in the form of a 20% solids aqueous slurry available from Saint-Gobain Industrial Ceramics, Inc. under the trade name NORPOL™ 9243.

500 Gm. of this slurry were diluted with 100 gm of de-ionized water and the pH was adjusted to 10 before the polishing was initiated.

The polishing removed 15 micrometers of thickness and left a surface roughness of 7–8 Å.

The polishing formulations of the invention therefore clearly are superior to those of the prior art. As represented by the commercially available ceria polishing powders or mixtures of ceria with alpha alumina powders with even finer nominal average particle size.

EXAMPLE 4

This Example shows the utility of the ceria formulations of the invention in the CMP treatment of silica surfaces. It is found that if the slurry used leaves debris on the surface rather than flushing it away, continued polishing over the debris can lead to defects on the polished surface. The significance of these defects depends to some extent on the area they cover. While slurry polishing cannot altogether eliminate defects caused by this mechanism, it is important to have as few defects as possible and for the total area occupied by such defects to be minimized. This implies early and effective debris removal during polishing. The following Example explores the factors influencing this result. All evaluations were carried out on a silica test-bed format. In such processes the key quality measuring parameters are the material removal rate and the surface defects greater than 0.2 micrometers in size remaining after the CMP operation, ("DEFECTS"), and the area occupied by the defects, (AREA").

A mechano-chemically treated ceria prepared as described in Example 1, except that only 72 hours of milling were used, was filtered and dispersed in deionized water containing 0.3% of Rhodafac BP769 anionic organo-phosphate surfactant with the pH adjusted to 6.3 using 30% ammonia, so as to give a slurry with a 3% ceria solids weight. Sufficient ammonia was added to adjust the pH to 10.1 and 0.3% of a Darvan C surfactant was added. This formulation, (INV-1), was compared in its ability to leave a defect-free surface against:

(a) the same formulation without the APE surfactant, (COMP-1); and (b) a similar formulation that received the same preparation but began with a different ceria having a higher ceria content available from the same supplier under the trade name "Opaline", (INV-2); and The MRR, or material removal rate in measured in Ångstroms/minute.

The results are set forth in the following Table in which the INV-1 performance is taken as 100% and the others are compared against that performance.

| SLURRY | MRR | DEFECTS | AREA |
|--------|-----|---------|------|
| COMP-1 | 137% | >350% | 413% |
| INV-1 | 100% | 100% | 100% |
| INV-2 | 73% | 293% | 66% |

From the above results it emerges that the Cerox slurry that contained no surfactant, (COMP-1), cut very aggressively but left behind substantial amounts of material on the surface leading to a very high DEFECTS value. The product according to the invention, (INV-1), made from the Cerox ceria powder cut less aggressively while leaving a much reduced number and area of Defects. The product according to the invention made from Opaline ceria powder, (INV-2), gave a lower MRR value and a higher DEFECTS number, (though still less than the product without the surfactant), but with a much smaller AREA than any of the others indicating that the defects were predominantly small.

EXAMPLE 5

In this Example the effect on the surfactant on the cleanliness of the substrate after polishing is clearly demonstrated. This demonstrates visually the effect described in Example 4.

One kilogram of ceria powder sold under the "Opaline" trade name was mixed with 9 kg of deionized water. This formulation was mixed as 30 g of a surfactant, (Darvan® C) and the pH was adjusted to 10.1 using a 15% ammonia solution. This mixture was then milled for 72 hours in a Sweco M-18 mill using half-inch low purity alumina media. Thereafter the resulting slurry was filtered through a one micron Pall filter and the residue was flushed with deionized water to recover the maximum amount of slurry.

A first sample of this slurry, (236.6 g containing 6.34% solids), was mixed with 264.3 g of deionized water and then mixed for 5 minutes using a magnetic stirrer. This slurry, which was prepared for comparative purposes, was then used to polish a wafer with a silica surface to a desired level of material removal. The wafer was then rinsed by immersion in five consecutive bath of aqueous ammonia at a pH of 10.1. A photograph was taken of the surface of the wafer and this is attached hereto as FIG. 5.

A similar slurry was prepared but this time with the addition of 7.5 g of APE surfactant used in Example 4 in 204.4 g of deionized water and a further 1.5 g of Darvan C in 50 g of deionized water. Once again the slurry was pH adjusted to 10.1 using 15% aqueous ammonia. This slurry was then used to polish a wafer with a silica surface in exactly the same way as the comparative sample described above. A photograph of the rinsed surface of the wafer after polishing shows no trace of surface debris indicating that the APE surfactant is particularly effective at leaving a surface that is clean and requires no further treatment to make it suitable for further processing. As indicated above, a clean surface usually correlates to a surface with few and smaller defects generated during the polishing process.

What is claimed is:

1. A process for the production of a ceria slurry suitable for optical polishing and CMP applications which comprises providing a ceria slurry with a BET surface area of less than 10 $m^2$/gm. and comprising a plurality of agglomerated ceria particles, and milling said slurry at a pH of from 9 to 12.5 until the BET surface area has increased by at least 5 $m^2$/gm.

2. A process according to claim 1 in which ceria is milled using milling media selected from the group consisting of low-purity alumina and zirconia.

3. A ceria slurry according to claim 2 which maintains a positive ionic surface charge when titrated from a pH of 4 or less to a pH of at least 10.

4. A ceria slurry obtained by a process according to claim 2 which further comprises an anionic organo-phosphate surfactant.

5. A ceria slurry obtained by a process according to claim 3 which further comprises an anionic organo-phosphate surfactant.

6. A ceria slurry according to claim 4 in which the ceria is essentially free of agglomerates.

7. A ceria slurry according to claim 5 in which the ceria is essentially free of agglomerates.

* * * * *